(12) United States Patent
Lee

(10) Patent No.: US 6,836,129 B2
(45) Date of Patent: Dec. 28, 2004

(54) AIR INTERFACE APPARATUS FOR USE IN HIGH-FREQUENCY PROBE DEVICE

(75) Inventor: Chaeyoon Lee, Busan (KR)

(73) Assignee: Leeno Industrial Inc., Busan (KR)

( * ) Notice: Subject to any disclaimer, the term of this patent is extended or adjusted under 35 U.S.C. 154(b) by 0 days.

(21) Appl. No.: 10/645,492

(22) Filed: Aug. 22, 2003

(65) Prior Publication Data

US 2004/0100295 A1 May 27, 2004

(30) Foreign Application Priority Data

Nov. 25, 2002 (KR) ................................ 10-2002-0073449

(51) Int. Cl.⁷ ............................................. G01R 27/26
(52) U.S. Cl. ........................ 324/690; 324/761; 324/762
(58) Field of Search ................................ 324/690, 761, 324/762

(56) References Cited

U.S. PATENT DOCUMENTS

| | | | | |
|---|---|---|---|---|
| 5,136,237 A | * | 8/1992 | Smith et al. ................. | 324/149 |
| 5,391,995 A | * | 2/1995 | Johnston et al. ............ | 324/761 |
| 5,512,838 A | * | 4/1996 | Roach ......................... | 324/754 |
| 6,229,327 B1 | * | 5/2001 | Boll et al. .................... | 324/762 |
| 6,489,795 B1 | * | 12/2002 | Klele et al. .................. | 324/762 |
| 6,496,714 B1 | * | 12/2002 | Weiss et al. ................. | 600/423 |
| 6,549,175 B1 | * | 4/2003 | Cencich et al. .............. | 343/830 |
| 2003/0189437 A1 | * | 10/2003 | Campbell ..................... | 324/754 |

FOREIGN PATENT DOCUMENTS

| | | | | |
|---|---|---|---|---|
| DE | 3430834 A | * | 3/1985 | ............ G01R/1/06 |
| FR | 2758395 A1 | * | 7/1998 | ............ G01R/1/06 |
| WO | WO 9854586 A1 | * | 12/1998 | ............ G01R/31/02 |

* cited by examiner

*Primary Examiner*—Charles H. Nolan, Jr.
(74) *Attorney, Agent, or Firm*—Jones Day

(57) ABSTRACT

An air interface apparatus is used for transmitting signals between an object under test and a probe device when the object under test is tested with the probe device. The air interface apparatus includes an inner conductor, an outer conductor which surrounds the inner conductor with a constant gap, a first signal pin being contacted to the object under test, a second signal pin being contacted to the probe device and inserted, an elastic spring for supporting the first and the second signal pins within the inner conductor, and an insulation ring for insulating the inner conductor and the outer conductor.

10 Claims, 5 Drawing Sheets

AIR INTERFACE APPARATUS FOR USE IN HIGH-FREQUENCY PROBE DEVICE

FIELD OF THE INVENTION

The present invention relates to an air interface apparatus for use in a high-frequency probe device; and, more particularly, to an air interface apparatus, which performs an interfacing function for transmitting high-frequency signals between a test device and the probe device used in testing electronic products and/or PCB boards, and whose inside is filled with air having a high relative dielectric constant to thereby improve signal transmission efficiency thereof.

DESCRIPTION OF RELATED ART

A printed circuit board (PCB) is an electronic product including a plurality of chips which are mounted on the surface of the PCB and are electrically connected to each other through buses formed on the surface of the PCB. The buses are formed by coating conductive materials along lines drawn on the surface of the PCB. The chips execute various functions and exchange electrical signals with each other through the buses.

A large scale integrated micro-chip is formed by integrating the PCB into high density and has predominant influence on the performance of an electronic product employing it therein. Therefore, in order to test whether the micro-chip included in the electronic product operates properly or not, it is required to test the micro-chip by using a test device. In performing the test, a probe device is used and more than one probe device are employed in a socket device for the test.

FIGS. 1A and 1B provide views of conventional probe devices employing a coil spring and an insulator.

The conventional probe device 100 has a plural type and a single type as shown in FIGS. 1A and 1B, respectively. In both of the plural and the single types, the probe device 100 includes a fixing block unit 120, a probe pin 110 whose one end is projected from an upper penetration hole of the fixing block unit 120, a coil spring 130 which is inserted into the fixing block unit 120 and whose one side encloses the other end of the probe pin 110, and a signal pin 140 whose one end is enclosed by the other side of the coil spring 130 and the other end is projected from a lower penetration hole of the fixing block unit 120.

That is, the probe pin 110 and the signal pin 140 are inserted into both sides of the fixing block unit 120, respectively. The probe pin 110 projected from the upper penetration hole of the fixing block unit 120 contacts an electrode of a micro-chip which is an object under test and the signal pin 140 projected from the lower penetration hole of the fixing block unit 120 contacts an electrode pad 152 of an interface board 150.

In other words, a contacting part of the probe pin 110 contacts the electrode of the object under test and that of the signal pin 140 contacts the electrode pad 152 of the interface board 150.

However, in the conventional probe device 100, since probing tips of the probe pin 110 and the signal pin 140 are in electrical contacts with both the object under test and the electrode pad 152, respectively, by the elastic force of the coil spring 130, the signal transmission path is not long. Therefore, the conventional probe device 100 has been only used to transmit the direct current (DC) or a low-frequency signal of several MHz. For instance, there is no obstacle in transmitting a low-frequency signal having a long wavelength through a transmission path of a limited length. However, in case of transmitting a high-frequency signal of hundreds of MHz or several GHz, since the probe device 110 has to transmit a high-frequency signal having a short wavelength through the transmission path of the limited length, there occurs substantial loss in the signal transmission and, thereafter, the probe device 110 is improper in the transmission of the high-frequency signal.

Furthermore, in the conventional probe device, insulating materials such as Teflon are used to electrically insulate the probe pin 110 and the fixing block unit 120 to thereby control characteristic impedance therebetween. However, the insulating materials have a mechanically unstable structure since it has a weak physical strength and there is caused a propagation delay due to a relative dielectric constant of the insulator such as Teflon.

SUMMARY OF THE INVENTION

It is, therefore, an object of the present invention to provide an air interface apparatus for use in a high-frequency probe device, which performs an interfacing function to transmit a high-frequency signal between a test device and the probe device used in testing electronic products or PCBs and whose inside is filled with air having a high relative dielectric constant to thereby increase transmission efficiency.

In accordance with the present invention, there is provided an air interface apparatus used as a signal transmission carrier between an object under test and a probe device when testing the object under test by using the probe device, which comprises: inner conductive means which has a long hollow cylindrical shape and whose both ends are open; outer conductive means whose both ends are open and which surrounds the inner conductive means with a constant gap and has a long cylindrical shape; a first signal pin being contacted to the object under test and inserted into and projected from one end of the inner conductive means; a second signal pin being contacted to the probe device and inserted into and projected from the other end of the inner conductive means; elastic means for supporting the first and the second signal pins within the inner conductive means to make the first and the second signal pins move in and out from both ends of the inner conductive means, respectively, by the elastic force of the elastic means in response to external pressure; and insulating means for insulating the inner conductive means from the outer conductive means, locating between the inner conductive means and the outer conductive means at both ends of the outer conductive means to thereby make the inner and the outer conductive means support each other.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 1:
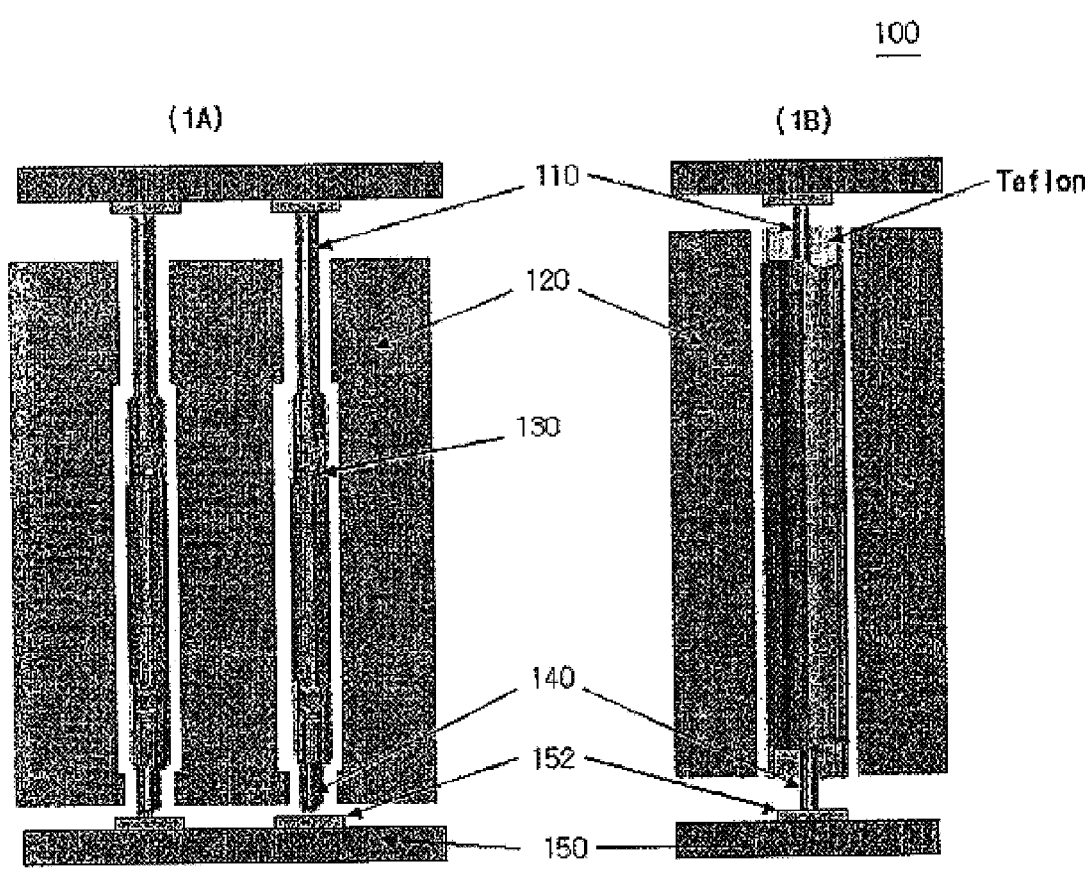
FIGS. 1A and 1B depict views of conventional probe devices employing a coil spring and an insulator.

Hereinafter, a preferred embodiment of the present invention will be described in detail with reference to the accompanying drawings. In the drawings, it is noticed that identical components are indicated with the same number although they are employed in different drawings.

Figure 2:
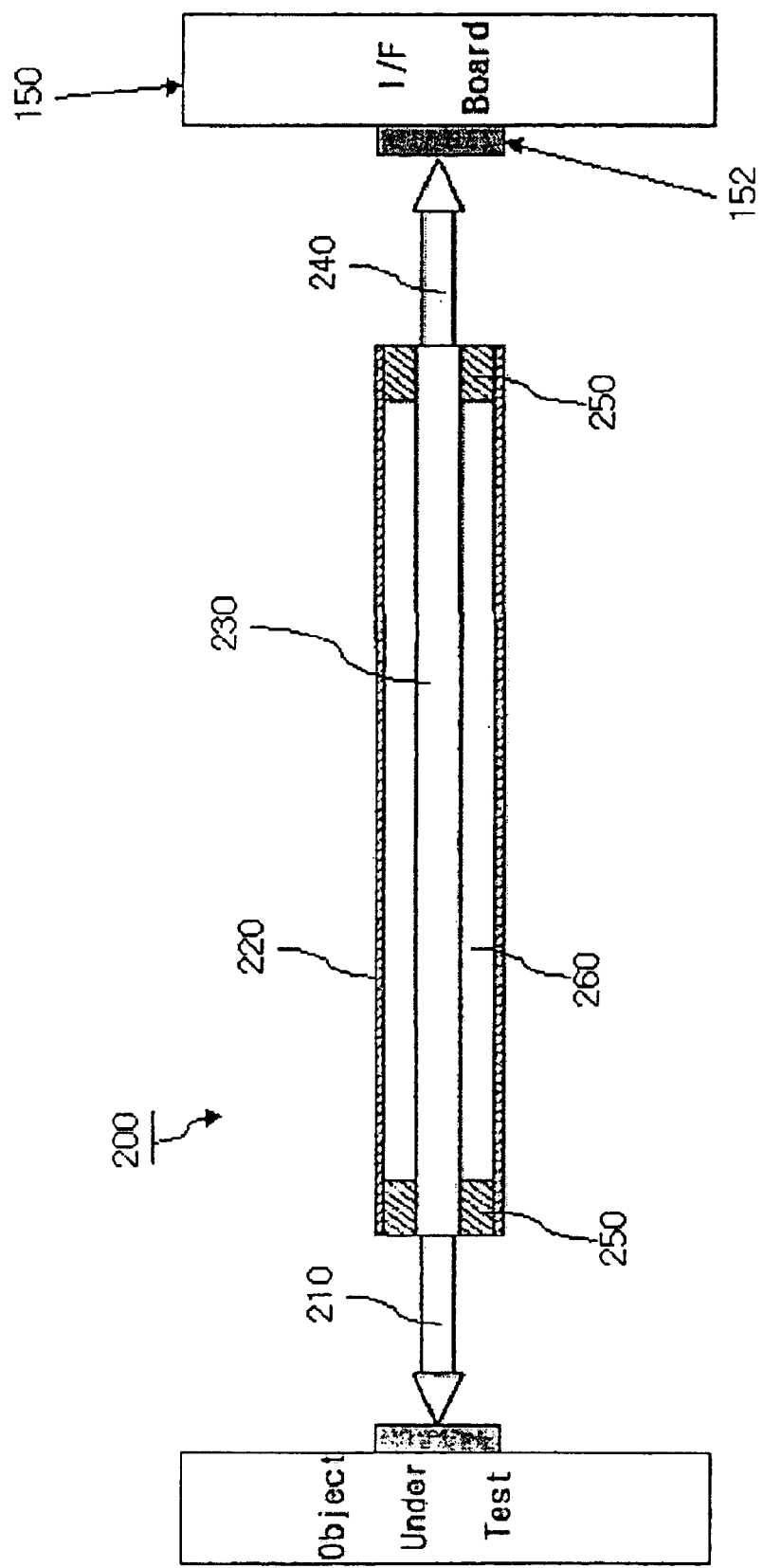
FIG. 2 provides a cross sectional view of an air interface apparatus for use in a high-frequency probe device in accordance with the present invention.

In FIG. 2, there is provided a cross sectional view of an air interface apparatus 200 for use in a high-frequency probe device in accordance with the present invention.

As shown in FIG. 2, the inventive air interface apparatus 200 includes an outer conductor 220 having a long cylindrical shape, an inner conductor 230 having a long hollow shape and inserted into the outer conductor 220, an insulation ring 250 embedded in both ends of the outer conductor 220 and the inner conductor 230 to thereby insulate and support the outer conductor 220 and the inner conductor 230, a first signal pin 210 inserted into and projected from a left end of the inner conductor 230 for the contact to an object under test, and a second signal pin 240 inserted into and projected from a right end of the inner conductor 230 for the contact to an electrode pad 152 of an interface board 150.

When testing a micro-chip, i.e., the object under test, by using the probe device, the first signal pin 210 in the air interface apparatus 200 makes contact with to the electrode of the micro-chip and the second signal pin 240 makes contact with the electrode pad 152 of the interface board 150. As a result, the air interface apparatus 200 plays a role of a carrier for signal transmission between the object under test and the probe device.

Figure 3:
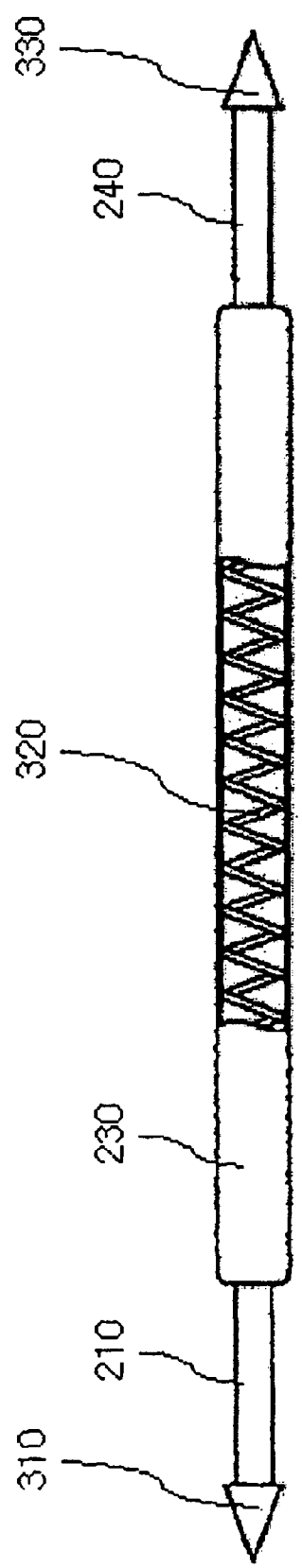
FIG. 3 represents a cross sectional view of an inner conductor including a first signal pin and a second signal pin inserted therein.

FIG. 3 represents a cross sectional view of the inner conductor 230 including the first signal pin 210 and the second signal pin 240 inserted therein.

As described in FIG. 3, the inner conductor 230 has a hollow cylindrical shape whose both ends are open. The first signal pin 210 is inserted into the left end of the inner conductor 230 and the second signal pin 240 is inserted into the right end of the inner conductor 230. The first and the second signal pins 210 and 240 have an elastic spring 320 connecting them there between and contain probing tips 310 and 330 formed at their projected ends, respectively.

Herein, the elastic spring 320 provides elastic force of restitution to the first signal pin 210 and the second signal pin 240 when the probing tip 310 of the first signal pin 210 contacts the micro-chip and the probing tip 330 of the second signal pin 240 contacts the electrode pad 152 of the interface board 150.

The elastic spring 320 is formed with conductive materials to make the current flow from the interface board 150 to the object under test and has an outside diameter smaller than an inside diameter of the inner conductor 230 to be inserted into the inner conductor 230. Further, in order to support the first and the second signal pins 210 and 240, an inside diameter of the elastic spring 320 is equal to or smaller than diameters of the first and the second signal pins 210 and 240.

The elastic spring 320 allows the first and the second signal pins 210 and 240 to make a firm contact with the object under test and the electrode pad 152, respectively, by providing its elastic force to the first and the second signal pins 210 and 240. Moreover, the first and the second signal pins 210 and 240 elastically move in and out from the inner conductor 230 by the elastic movement of the elastic spring 320.

By virtue of the elastic force of the elastic spring 320, the first and the second signal pins 210 and 240 can be correctly contacted to all test points of the object under test and the electrode pad 152 although the contacting surfaces are irregular. At this time, an internal wall of the inner conductor 230 supports the movement of the first and the second signal pins 210 and 240.

In FIGS. 2 and 3, while the first and the second signal pins 210 and 240 are inserted into the inside of the inner conductor 230 and do not easily come out therefrom in ordinary situation, they can be easily pulled out of the inner conductor 230 when a pulling force is applied from outside. Therefore, when the first and the second signal pins 210 and 240 are damaged for a certain reason, it is easy to replace the first and the second signal pins 210 and 240 with new ones.

The inner conductor 230 implements an impedance matching in cooperation with the outer conductor 220 as well as used as a socket employing the first and the second signal pins 210 and 240. That is to say, the characteristic impedance of a conductive unit is adjusted by the outside diameter of the inner conductor 230 and the inside diameter of the outer conductor 220, wherein the conductive unit includes the inner conductor 230 and the outer conductor 220.

The outer conductor 220 adjusts the characteristic impedance in cooperation with the inner conductor 230 as well as playing a role of electro-magnetically shielding the inner conductor 230 from outside. The outer conductor 220 is a hollow conductor whose inside diameter is about 0.9 mm and outside diameter is about 1.2 mm.

In order to achieve lossless transmission of signals that which are provided from the object under test through the first signal pin 210, to a test instrument, there must be the impedance matching between the signal path and a signal input terminal of the test instrument. In general, industry requires that the signal path be impedance-matched with the characteristic impedance of 75 Ω or 50 Ω. Therefore, in accordance with an embodiment of the present invention, the characteristic impedance is regulated to 50 Ω by adjusting the outside diameter of the inner conductor 230 and the inside diameter of the outer conductor 220. Herein, the characteristic impedance Z is calculated as shown in Equation 1.

$$Z = \frac{138}{\sqrt{dielectricconstant}} * \log_{10}\left(\frac{insidediameterofouterconductor}{outsidediameterofinnerconductor}\right) \quad [\text{Equation 1}]$$

In Equation 1, the characteristic impedance may be varied according to dielectric materials filling a space between the outer conductor 220 and the inner conductor 230. In general, Teflon is used as a dielectric material for the impedance matching in the probe device. However, when using Teflon having a relative dielectric constant of about 2.1 as the dielectric material, it is impossible to achieve the goal of the present invention to provide a probe device feasible in a fine pitch shorter than 1.27 mm since the thickness of the inner conductor 230 and the outer conductor 220 becomes larger.

Therefore, in accordance with the embodiment of the present invention, air 260 having a lower relative dielectric constant than Teflon is used for obtaining desired characteristic impedance feasible in the fine pitch. Namely, only the air 260 is used to fill the space between the outer conductor 220 and the inner conductor 230 since the relative dielectric constant $\epsilon_r$ of the air 260 is 1.

As described above, in accordance with the present invention, by using the air 260 as the dielectric material and adjusting the inside and outside diameters of the cylindrical conductors 220 and 230, the characteristic impedance can be matched at the conductors 220 and 230. As a result, the inventive air interface apparatus 200 can transmit signals from the object under test to the probe device without loss and, thus, it can be used in measuring the impedance of PCB boards and testing ICs for high-frequency.

In FIG. 2, the insulation ring 250 is employed to electrically insulate the outer conductor 220 from the inner conductor 230 and support the inner conductor 230 at the center of the outer conductor 220. The insulation ring 250 is located at both ends of the outer conductor 220 to support the inner conductor 230.

Although the insulation ring 250 can have influence on the characteristic impedance of the conductors 220 and 230, the influence is very small as much as ignorable. However, if the influence of the insulation ring 250 is concerned, it is possible to cancel the variance of the characteristic impedance due to the insertion of the insulation ring 250 by adjusting the inside diameter of the outer conductor 220 and the outside diameter of the inner conductor 230.

Figure 4:
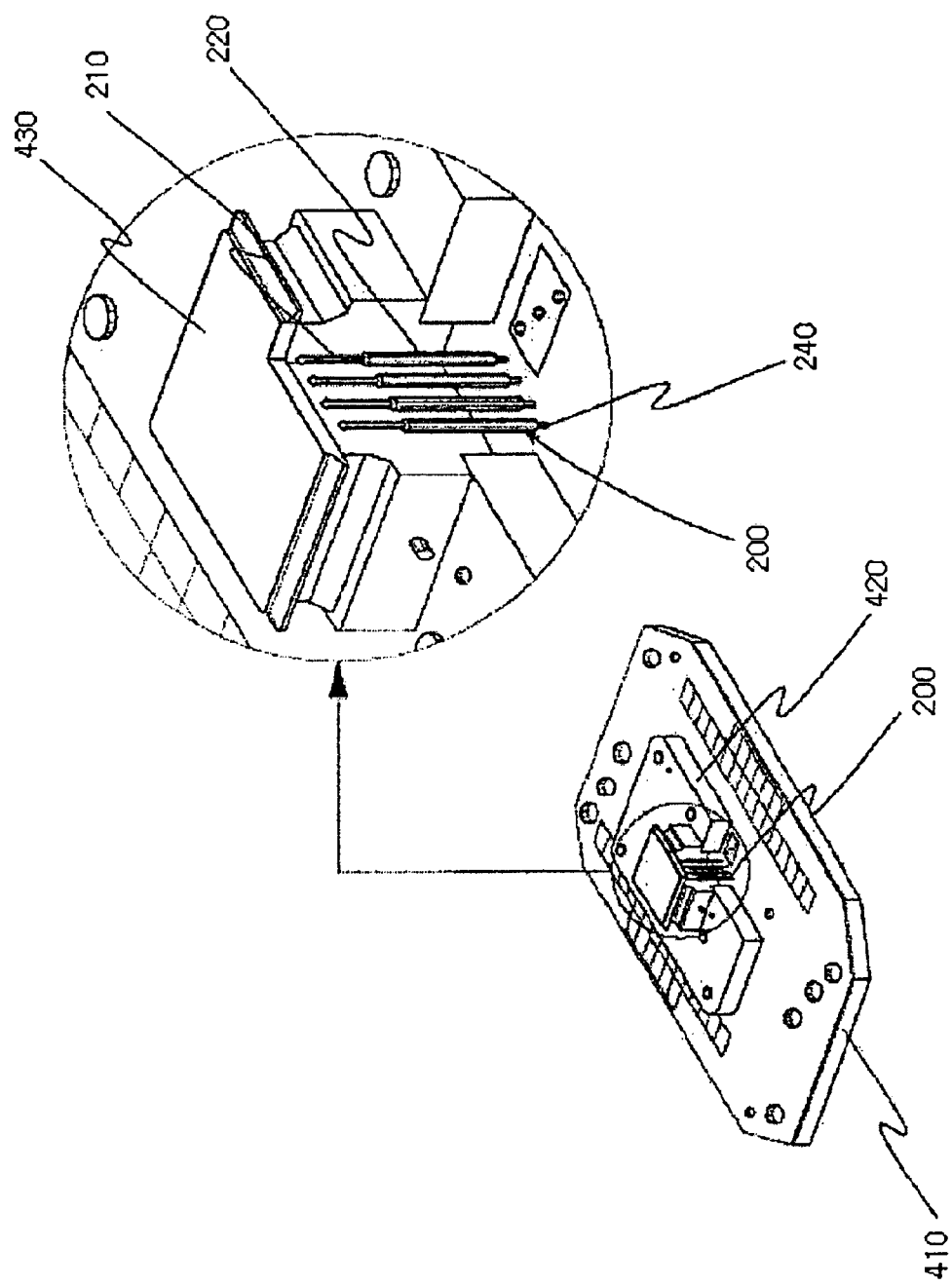
FIG. 4 shows a view of testing an object under test by using the air interface apparatus in accordance with the present invention.

FIG. 4 shows a view of testing the object under test by using the air interface apparatus in accordance with the present invention.

As depicted in FIG. 4, there is a socket 420 on a circuit board 410 for test and an object under test, i.e., a micro-chip 430, is on the top of the socket 420. The socket 420 employs a multiplicity of air interface apparatuses and the upper portion of the air interface apparatus 200 is connected to the first signal pin 210. Thus, the micro-chip 430 is tested by making current flow from the micro-chip 430 to the circuit board 410 through a body portion of the air interface apparatus 200 and the second signal pin 240 of a lower portion of the air interface apparatus 200 at a state of the end of the air interface apparatus 200 being contacted to several points of the micro-chip 430.

Figure 5:
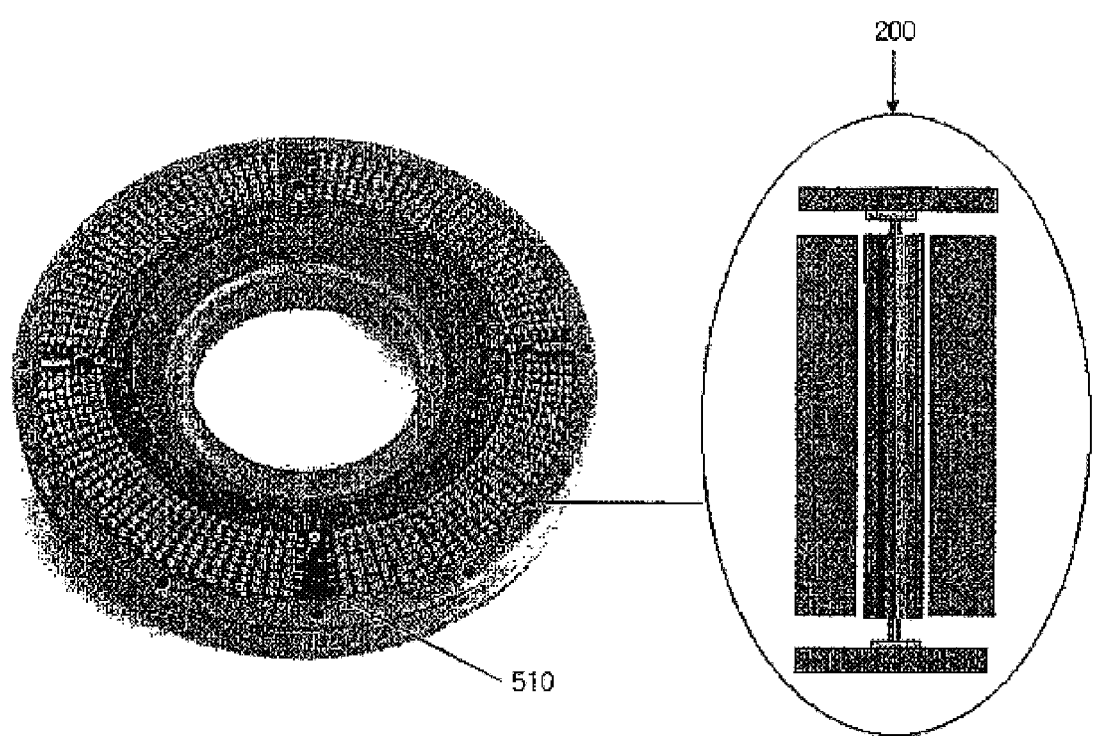
FIG. 5 is an exemplary application of the air interface apparatus in accordance with the present invention.

FIG. 5 is an exemplary application of the air interface apparatus in accordance with the present invention.

As shown in FIG. 5, a socket 510 having a doughnut shape includes 1,738 air interface apparatuses therein. Therefore, it is possible to test ICs and micro-chips in large quantities. That is, since the air interface apparatus 200 has the shape shown in FIG. 2, the object under test can be accurately tested with the first and the second signal pins 210 and 240 although the test is performed in large quantities.

As described above, the first and the second signal pins 210 and 240 of the air interface apparatus 200 can move in and out through the movement of the elastic spring 320. Thereafter, the first and the second signal pins 210 and 240 can be correctly contacted to a board whose surface is irregular and non-uniform and perform accurate test for the board.

Therefore, in accordance with the present invention, the air interface apparatus can transfer signals provided from the object under test to the probe device without loss by matching the characteristic impedance at the conductors 220 and 230 transmitting signals by using the air 260 as the dielectric material and adjusting the inside and the outside diameters of the cylindrical conductors 220 and 230. As a result, the air interface apparatus can be used for measuring the impedance of high-frequency PCB boards, testing high-frequency ICs, and interfacing high-frequency signals. Furthermore, the air interface apparatus can be employed in an automation facility for testing PCB boards and electrical components.

While the present invention has been described with respect to the particular embodiments, it will be apparent to those skilled in the art that various changes and modifications may be made without departing from the spirit and scope of the invention as defined in the following claims.

What is claimed is:

1. An air interface apparatus that operates as a signal transmission carrier between an object under test and a probe device when testing the object under test by using the probe device, which comprises:

inner conductive means which has a long hollow cylindrical shape and whose both ends are open;

outer conductive means whose both ends are open and which surrounds the inner conductive means with a constant gap and has a long cylindrical shape;

a first signal pin being contacted to the object under test and inserted into and projected from one end of the inner conductive means;

a second signal pin being contacted to the probe device and inserted into and projected from the other end of the inner conductive means;

elastic means for supporting the first and the second signal pins within the inner conductive means to make the first and the second signal pins move in and out from both ends of the inner conductive means, respectively, by the elastic force of the elastic means in response to external pressure; and insulating means for insulating the inner conductive means from the outer conductive means, locating between the inner conductive means and the outer conductive means at both ends of the outer conductive means to thereby make the inner and the outer conductive means support each other.

2. The air interface apparatus recited in claim 1, wherein air fills an empty space between the inner conductive means and the outer conductive means.

3. The air interface apparatus recited in claim 1, wherein, when testing the object under test by using the probe device, the first signal pin is contacted to the object under test and the second signal pin is contacted to the probe device, thereby acting as carriers for transmitting signals between the object under test and the probe device.

4. The air interface apparatus recited in claim 1, wherein each of the first and the second signal pins includes a probing tip formed at its projected end.

5. The air interface apparatus recited in claim 1, wherein the elastic means is formed with conductive material to make current flow from the probe device to the object under test; wherein the elastic means has an outside diameter smaller than an inside diameter of the inner conductive means, thereby being inserted into the inner conductive means; and wherein the elastic means has an inner diameter equal to or smaller than diameters of the first and the second signal pins to support the first and the second signal pins.

6. The air interface apparatus recited in claim 1, wherein, while the first and the second signal pins are inserted into the inside of the inner conductive means and are not easily releasable therefrom, the first and the second signal pins are easily released of the inner conductive means when there is an external pulling pressure, the first and the second signal pins being replaceable when the first and the second signal pins are damaged.

7. The air interface apparatus recited in claim 4, wherein, while the first and the second signal pins are inserted into the inside of the inner conductive means and are not easily releasable therefrom, the first and the second signal pins are easily released of the inner conductive means when there is an external pulling pressure, the first and the second signal pins being replaceable when the first and the second signal pins are damaged.

8. The air interface apparatus recited in claim 1, wherein the inner conductive means implements the impedance matching in cooperation with the outer conductive means and functions as a socket that can be releasably mated with the first and the second signal pins.

9. The air interface apparatus recited in claim 4, wherein the inner conductive means implements the impedance matching in cooperation with the outer conductive means and functions as a socket that can be releasably mated with the first and the second signal pins.

10. The air interface apparatus recited in claim 1, wherein the inner and the outer conductive means define a characteristic impedance that is controlled by adjustment of an outside diameter of the inner conductive means and of an inside diameter of the outer conductive means.

* * * * *